US010351677B2

(12) United States Patent
Zhou et al.

(10) Patent No.: US 10,351,677 B2
(45) Date of Patent: Jul. 16, 2019

(54) GRAPHENE-CONTAINING COMPOSITE MATERIAL, PREPARATION METHOD AND USE THEREOF

(71) Applicant: SHANGHAI UNIVERSITY OF ENGINEERING SCIENCE, Shanghai (CN)

(72) Inventors: Chao Zhou, Shanghai (CN); Sihao Chen, Shanghai (CN); Jianzhong Lou, Shanghai (CN)

(73) Assignee: SHANGHAI UNIVERSITY OF ENGINEERING SCIENCE, Shanghai (CN)

( * ) Notice: Subject to any disclaimer, the term of this patent is extended or adjusted under 35 U.S.C. 154(b) by 239 days.

(21) Appl. No.: 15/526,427

(22) PCT Filed: Dec. 23, 2014

(86) PCT No.: PCT/CN2014/001167
§ 371 (c)(1),
(2) Date: May 12, 2017

(87) PCT Pub. No.: WO2016/090523
PCT Pub. Date: Jun. 16, 2016

(65) Prior Publication Data
US 2018/0291157 A1    Oct. 11, 2018

(30) Foreign Application Priority Data

Nov. 13, 2014  (CN) .................... 2014 1 0640645

(51) Int. Cl.
| | |
|---|---|
| *H01L 51/00* | (2006.01) |
| *H01B 1/04* | (2006.01) |
| *H01M 4/583* | (2010.01) |
| *C08G 83/00* | (2006.01) |
| *C09D 5/24* | (2006.01) |
| *C09D 165/00* | (2006.01) |
| *C08K 9/04* | (2006.01) |
| *C08L 7/00* | (2006.01) |
| *C08L 65/00* | (2006.01) |

(Continued)

(52) U.S. Cl.
CPC .......... *C08G 83/001* (2013.01); *C01B 32/194* (2017.08); *C08J 7/047* (2013.01); *C08K 9/04* (2013.01); *C08L 7/00* (2013.01); *C08L 65/00* (2013.01); *C08L 67/02* (2013.01); *C08L 69/00* (2013.01); *C08L 75/04* (2013.01); *C09D 5/24* (2013.01); *C09D 5/34* (2013.01); *C09D 7/65* (2018.01); *C09D 127/08* (2013.01); *C09D 165/00* (2013.01); *C09D 167/00* (2013.01); *C09D 169/00* (2013.01); *C09D 187/005* (2013.01); *H01B 1/127* (2013.01); *H01B 1/128* (2013.01); *H01B 1/24* (2013.01); *C08G 61/126* (2013.01); *C08G 2261/3223* (2013.01); *C08G 2261/3243* (2013.01); *C08G 2261/43* (2013.01); *C08G 2261/512* (2013.01); *C08G 2261/514* (2013.01); *C08G 2261/77* (2013.01); *C08G 2261/90* (2013.01); *C08G 2261/964* (2013.01); *C08J 2339/04* (2013.01); *C08K 3/042* (2017.05); *H01C 10/103* (2013.01); *H05K 9/0081* (2013.01)

(58) Field of Classification Search
CPC .......... C08G 2261/77; C08G 2261/514; C08G 2261/3243; H01B 1/04; H01B 1/24; H01B 1/27; C08K 3/042
USPC ......................... 252/500, 510, 511
See application file for complete search history.

(56) References Cited

U.S. PATENT DOCUMENTS

| | | | | |
|---|---|---|---|---|
| 2011/0186789 A1* | 8/2011 | Samulski | ............... | B82Y 30/00 252/514 |
| 2014/0220235 A1* | 8/2014 | Thalappil | ............. | C09K 11/025 427/64 |

(Continued)

FOREIGN PATENT DOCUMENTS

JP        2013216766 A  * 10/2013  .............. C08L 65/00

OTHER PUBLICATIONS

Yoo "Direct synthesis of highly conductive poly(3,4-ethylenedioxythiophene):poly(4-styrenesulfonate)(PEDOT:PSS)/graphene composites and their applications in energy harvesting systems." Nano Research 2014, 7(5): 717-730 (Year: 2014).*

*Primary Examiner* — Tri V Nguyen
(74) *Attorney, Agent, or Firm* — Ware, Fressola, Maguire & Barber LLP

(57) ABSTRACT

A graphene-containing composite material comprises components of a composite functional material with a double-conductive channel and a polymer matrix. The composite functional material with a double-conductive channel is sulfonated graphene surface grafted conductive polymer poly-3,4-(ethylenedioxythiophene). The composite functional material with a double-conductive channel and the graphene-containing composite material can be used for preparing a piezoresistance response material or an antistatic or electromagnetic shielding material and the like, and have excellent piezoresistance response, piezoresistance repeatability and electromagnetic shielding effect. The present invention is simple and easy to operate, can be used in large scale production, has excellent piezoresistance performance and very sensitive piezoresistance response, with the percolation threshold being only 0.5 wt %; not only the original performance of the polymer can be maintained, but also an unstable conductive network system can be formed, which (Continued)

facilitates the improvement of the sensitivity of the piezoresistance response.

16 Claims, 5 Drawing Sheets

(51) Int. Cl.
*C08L 67/02* (2006.01)
*C08L 69/00* (2006.01)
*C08L 75/04* (2006.01)
*C08J 7/04* (2006.01)
*C09D 187/00* (2006.01)
*C09D 127/08* (2006.01)
*C09D 5/34* (2006.01)
*C09D 167/00* (2006.01)
*C09D 169/00* (2006.01)
*C09D 7/65* (2018.01)
*H01B 1/12* (2006.01)
*H01B 1/24* (2006.01)
*C01B 32/194* (2017.01)
*C08K 3/04* (2006.01)
*H01C 10/10* (2006.01)
*H05K 9/00* (2006.01)
*C08G 61/12* (2006.01)

(56) References Cited

U.S. PATENT DOCUMENTS

2014/0342142 A1\* 11/2014 Wu .................. H01B 1/24
  428/220
2017/0158815 A1\* 6/2017 Hu .................. C08L 65/00

\* cited by examiner

GRAPHENE-CONTAINING COMPOSITE MATERIAL, PREPARATION METHOD AND USE THEREOF

TECHNICAL FIELD

The present invention relates to a graphene-containing composite material and a preparation method and use thereof.

BACKGROUND

Graphene is a two-dimensional crystal of a hexagonal honeycomb-like structure consisting of a single layer of carbon atoms. An ideal graphene structure is a planar hexagonal lattice, which can be regarded as a stripped single layer of a graphite molecule with each carbon atom being $sp^2$ hybridized and contributing the remaining p-orbital electron to the formation of a delocalized $\pi$ bond where $\pi$-electrons are freely movable, imparting the graphene with good conductivity. The two-dimensional graphene structure can be seen as the basic structural element of all $sp^2$ hybridized carbon materials. Graphene contains approximately 0.143 nm long C—C bonds as well as lattice elements each having three σ bonds which are rather strong and ensure stability of the hexagons. A single graphene layer has a thickness of only 0.35 nm, about 1/200,000 of the diameter of a hair shaft.

Graphene has been found to have many novel and unique physical phenomena to date such as massless Dirac fermions, the quantum Hall effect, room-temperature magnetic behavior and room-temperature spin-dependent transport. More importantly, graphene with the unique structure has multiple excellent properties, including a small mass density (2.2 g/cm$^3$), extremely large specific surface area (~2630 m$^2$/g), extremely high intrinsic mobility (>104 cm$^2$/Vs, higher than ten times that of commercial silicon wafers), resistivity of only about $10^{-6}$ Ω·cm, the lowest as so far found in the world, outstanding thermal conductivity (3000 W·m$^{-1}$·K$^{-1}$, 3 times that of diamond) and mechanical characteristics (its Young's modulus is as high as up to 1.0 TPa, higher than 100 times that of steel). In graphene, electrons move faster than in pure metals and semiconductors at a speed that is up to 1/300 of the speed of light. Although graphite is the softest mineral whose Mohs hardness is in the range of only 1 to 2, after being exfoliated into graphene with a thickness equal to the diameter of a single carbon atom, it will undergo abrupt changes in properties and exhibit a Mohs hardness higher than that of diamond (10) and high strength of up to 130 GPa, while maintaining high toughness and arbitrary flexibility. In addition, graphene is nearly transparent with an optical absorbance of only 2.3% over a wide wavelength band. Thanks to its fastest room-temperature electrical conduction velocity, greatest mechanical strength, strongest thermal conductivity and other properties, it is potentially applicable to critical applications including nanoelectronic devices, optoelectronic devices, sensors, super capacitors, energy storage, integrated circuits for fuel cells, transistors and FETs.

Graphene/polymer composite materials can be prepared from in-situ growth of organic molecules introduced between graphite layers through melt blending, solution blending, solution intercalation or the like. In addition to its wide variety of excellent properties including high strength, high conductivity, high light transmittance, high hardness, high bather ability and quantum Hall effect at room temperature, graphene is suitable for use in many applications also because of the abundance and low cost of its raw materials (graphite, hydrocarbons, etc.). Preparation through addition of graphene to polymers is currently the focus of research on the development of high-performance, multi-functional, intelligent composite materials. However, direct addition of graphene to polymers tends to fail to meet the requirements of actual production, as further functional modifications and structural designs are necessary for enabling their functionality and intelligence.

Among the multi-functional, intelligent composite materials, the preparation of piezo-resitive-responsive composites usually employs techniques using carbon black, carbon nanotubes, or regular graphene as filler. These techniques, however, are associated with a number of issues. For example, piezoresistive composites containing carbon black as filler suffer from low sensitivity, high filler contents and unsatisfactory repeatability. While those prepared using carbon nanotubes as filler exhibit relatively high piezoresistive sensitivity and low filler contents, such excellent piezoresistive characteristics cannot be repeated as expected in cycle tests. There have also been attempts using graphene as filler in which alkylation is further performed in order to enhance the bonding between the conductive filler and polymer matrix and hence the piezoresistive response. However, this only mitigates the interfacial bonding issue but fails to address the interfacial bonding and piezoresistive response issues fundamentally from the root causes. For these reasons, we developed a graphene/conductive polymer composite material by sulfonation of graphene surface by grafting and subsequent bonding of in-situ polymerized poly(3,4-ethylenedioxythiophene) (PEDOT) using hydrogen bonds. This material can be used alone as, or composited with polymer(s) to form, a piezo resistive material.

Research efforts made in sofar in multi-functional, intelligent graphene/polymer composite materials are essentially as follows: Chinese Patent Publication No. CN102173145A of Chinese Patent Application No. 201210144498.X, filed May 10, 2012, published Sep. 19, 2012, entitled "Surface Modified Graphene/Polymer-Based Piezoresistive Composite Material and Preparation Method thereof", which discloses a piezoresistive-responsive material prepared by compositing silicone rubber with alkylated graphene as filler.

Chinese Patent No. CN102558772B of Chinese Patent Application No. 201110419526.X, filed Dec. 15, 2011, issued Mar. 6, 2013, entitled "PEDOT/Sulfonated Graphene Composite Hydrogel and Preparation Method Thereof", which discloses a composite hydrogel with improved electrical properties and mechanical strength formed by mixing PEDOT, sodium polystyrene sulfonate and sulfonated graphene as the individual constituents.

Chinese Patent Publication No. CN103824615A of Chinese Patent Application No. 201410055227.6, filed Feb. 18, 2014, published May 28, 2014, entitled "Method for Flexible Transparent Electrode of Laminated Vapor-Phase Polymerized PEDOT and Graphene", which discloses a composite sheet with improved electrical conductivity and flexibility prepared by laminating PEDOT and graphene films.

These research efforts, however, fail to address the interfacial bonding issue while achieving enhancements in electrical conductivity, mechanical strength, flexibility, etc.

SUMMARY

It is an object of the present invention to address the drawbacks of the prior art by presenting a graphene-containing composite material and a preparation method and use thereof.

The present invention relates first to a functional composite material with a double-conductive channel, which is sulfonated graphene whose surface is grafted with conductive poly(3,4-ethylenedioxythiophene) (PEDOT) polymer, of the following general formula (1):

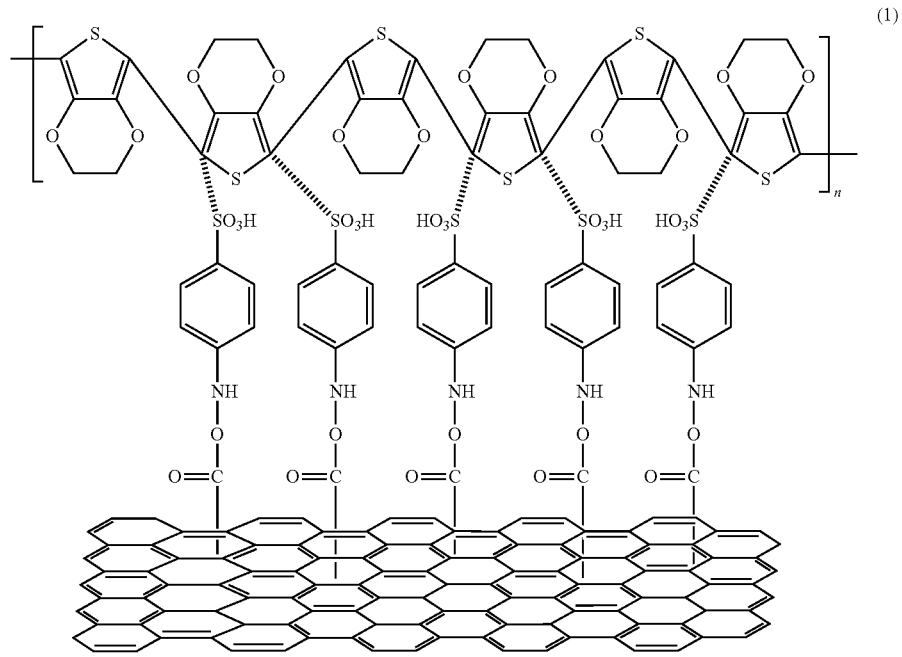

(1)

where, n represents the degree of polymerization and is an integer in the range of 100 to 8000.

The sulfonated graphene and the PEDOT may be present in a weight ratio of 1:1 to 1:100. Preferably, the weight ratio of the sulfonated graphene to the PEDOT is from 1:3 to 1:10.

The sulfonated graphene may be obtained by grafting 4-aminobenzenesulfonic acid or a derivate thereof to graphene with a graft ratio of 1% to 80%.

Reference can be made to Guoxia. et al. Sulfonated Graphene for Persistent Aromatic Pollutant Management. Adv. Mater. 2011, 23, 3959-3963, for more information about preparation of the sulfonated graphene. The literature recommends a method including the following steps:

1) dispersing carboxylated graphene in water to obtain a 1-10 mg/mL carboxylated graphene solution A;

2) dissolving 4-aminobenzenesulfonic acid in water to obtain a 10-20 mg/mL solution B;

3) mixing the solution A and the solution B in a volume ratio of 2:3-2:5, adding 1-3 drops of dibutyltin dilaurate as a catalyst, heating the mixture with reflux to allow reaction at 90-95° C. for 8-10 hours, cooling the system to a temperature of 85-90° C., adding thereto hydrazine hydrate and allowing reaction for 2-3 hours with the temperature being maintained, thereby obtaining the sulfonated graphene.

A ratio of the amount of the added hydrazine hydrate to that of the carboxylated graphene ranges from 1 mL/g to 2 mL/g.

The weight of the catalyst accounts for 0.1-0.3% of the aggregated volume of the solutions A and B.

The compound of the formula (1) can be molded alone as a functional composite material with a double-conductive channel.

The present invention also relates to a method of preparing a graphene-containing composite material comprising constituents including the functional composite material with a double-conductive channel and a polymer matrix.

Preferably, in the graphene-containing composite material, the functional composite material with a double-conductive channel and the polymer matrix are present in a weight ratio of 0.1:100 to 20:100. Preferably, the polymer matrix is present in a weight ratio of 1:100 to 10:100.

The polymer matrix may be selected from a polyolefin-based polymer, a polyester-based polymer, a rubber-based polymer or polyoxymethylene, polysulfone and polylactic acid.

The polyolefin-based polymer is preferably polyethylene, polypropylene, polystyrene or polyvinylidene chloride.

The polyester-based polymer is preferably polyethylene terephthalate or polycarbonate.

The rubber-based polymer is preferably silicone rubber.

A method of preparing the functional composite material with a double-conductive channel includes the steps of:

1) dissolving the sulfonated graphene in water, thereby obtaining a sulfonated graphene solution with a concentration ranging from 1 mg/mL to 20 mg/mL;

2) adding 3,4-ethylenedioxythiophene (EDOT), wherein the EDOT and the sulfonated graphene are present in a weight ratio of 1:1 to 100:1, with 3:1 to 10:1 being preferred;

further adding a 5-30 wt. % sodium persulfate ($Na_2S_2O_8$) solution such that the weight of the added sodium persulfate accounts for 10-60% of that of the sulfonated graphene, followed by reaction at room temperature for 4-8 hours and gathering and concentration of a PEDOT/graphene composite paste from the reaction products, thereby obtaining the concentrated PEDOT/graphene composite paste as a paste form of the functional composite material with a double-conductive channel, wherein the gathering can be accomplished, for example, by concentration by evaporation; and directly curing the paste to obtain a PEDOT/graphene functional composite material which is the functional composite material with a double-conductive channel.

The term "curing" refers a process including:

loading the paste of the functional composite material into a mold and drying it in a vacuum drying oven at 40-80° C. for 12-24 hours, thus obtaining the graphene-containing functional composite material.

Alternatively, the following step may be included:

blending the paste with a polymer matrix using a blending process including melt blending or solution blending, obtaining a blended system using a curing processing including solvent evaporation or addition of a curing agent, and finally obtaining the graphene-containing composite material.

Alternatively, the following step may also be included:

coating the paste on the surface of a polymer, metal, organic or fabric substrate and curing it in vacuum at a temperature of 40-80° C. into a functional composite sheet with a thickness of 0.1 μm-10 mm, thereby obtaining the graphene-containing composite material, wherein the sheet is of a B/A, B/A/B or A/B/A structure, where A represents a functional film, and B denotes a polymer film.

The functional composite material with a double-conductive channel may be used for preparing a piezoresistive-responsive material, an antistatic material, an electromagnetic shielding material, or the like. Experimental results show that it has excellent piezoresistive response, piezoresistive repeatability and electromagnetic shielding effects.

The present invention is simple and easy to operate, and can be used in massive production of sulfonated graphene. Surface grafting of sulfonic acid groups, on the one hand allows the graphene to have effectively reduced surface energy and to be hence dispersed in deionized water at a high concentration and, on the other hand, provides functional groups for the subsequent grafting of the conductive polymer. This further strengthens the binding and compatibility between the graphene and polymer, enabling the preparation of the functional composite material with a double-conductive channel.

Because of the presence of the double-conductive channel, the functional composite material has exceptionally excellent piezoresistive properties. The conductive polymer/functionalized graphene/polymer functional composite material, when used alone, provides very sensitive piezoresistive response, and its percolation threshold is as low as up to 0.5 wt %, lower than those of carbon nanotubes composite materials (1.2 wt %) and graphene composite materials (0.7 wt %) that have been subjected to the same surface modifications. The lower addition can not only maintain the original properties of the polymer, but also forms an unstable conductive network system, which helps improve the sensitivity of the piezoresistive response.

As the PEDOT/graphene composite paste can be either cured/molded alone or composited with other materials to form piezoresistive-responsive functional materials, it has a very wide range of applications.

The large specific surface area of the graphene can work synergistically with the PEDOT grafts to impart excellent piezoresistive repeatability to the resulting functional composite material. In contrast, under the same conditions, carbon nanotubes or non-grafted graphene composite materials cannot build internal conductive networks adaptable to variations in external forces, and their excellent piezoresistive properties are thus not repeatable.

The preparation method according to the present invention is simple and easy to operate, and does not require large processing equipment. This is conducive to the massive low-cost production of the functional composite material.

DETAILED DESCRIPTION

The present invention will be described in greater detail with reference to several specific embodiments which are presented for illustration only without limiting the invention in any sense. These embodiments are examples of practical use that will be readily understood and validated by those skilled in the art. Any changes made in light of the present invention are considered as not essentially deviating from the scope of the invention.

EXAMPLE 1

1) Preparation of Sulfonated Graphene

Carboxylated graphene was dispersed in deionized water and the dispersion was facilitated by ultrasonic waves for 2 hours, so that a 10 mg/mL carboxylated graphene solution was prepared for subsequent use.

4-Aminobenzenesulfonic acid was dissolved in deionized water to prepare a 20 mg/mL solution for subsequent use.

Figure 1:
FIG. 1 is a microscopic image of sulfonated graphene.

The two solutions obtained above were mixed together in a volume ratio of 2:3, followed by addition thereto of 1-3 drops of dibutyltin dilaurate as a catalyst. The mixture was then heated with reflux at 95° C. to allow reaction for 10 hours. The system was then cooled to 90° C. and added with hydrazine hydrate, followed by reaction for 2 hours at the temperature that was maintained. A ratio of the amount of the added hydrazine hydrate to that of the carboxylated graphene was 1.0 mL:0.8 g. As a result, sulfonated graphene was obtained, and its morphology and surface groups were characterized, with the results shown in FIG. 1. As can be seen from this figure, the sulfonated graphene appeared as very thin sheets with a grafting ratio of 40%.

2) Preparation of Conductive Polymer/Functionalized Graphene Composite Material

At first, 100 mg of the sulfonated graphene resulting from step 1) was weighed and dissolved in 100 mL of deionized water, resulting in a 1 mg/mL sulfonated graphene solution which was then added with 5 g of 3,4-ethylenedioxythiophene (EDOT) as a monomer and a certain amount of a sodium persulfate ($Na_2S_2O_8$) solution as an initiator. The mixed solution was then maintained at room temperature to allow reaction for 4 hours. After spin distillation and concentration, a poly (3,4-ethylenedioxythiophene) (PEDOT)/graphene composite was obtained in the form of a paste, whose infrared spectrum was shown in FIG. 2. In the composite, sulfonated graphene and PEDOT were present in a mass ratio of 3:1, and n=400.

Figure 2:
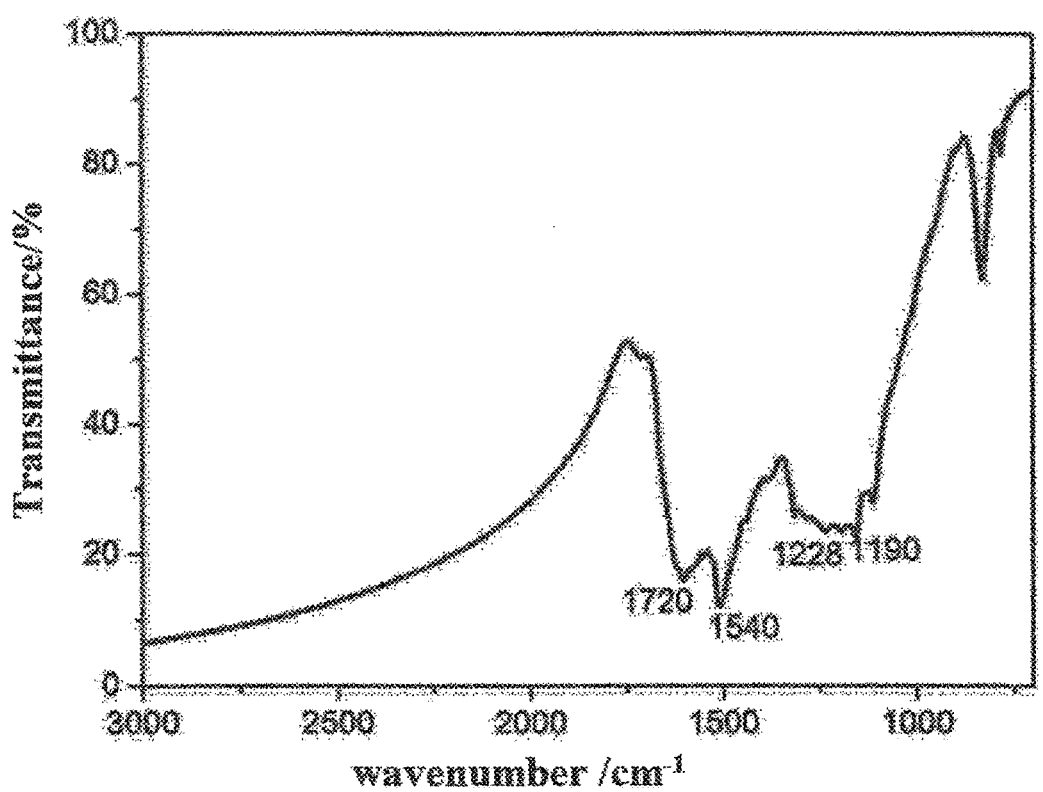
FIG. 2 is an infrared spectrum of a PEDOT/graphene functional composite material.

In FIG. 2, there are a characteristic peak of sulfonic acid groups at 1190 cm$^{-1}$, a peak at 1228 cm$^{-1}$ resulting from the stretch vibrations of C—O—C bonds, most of which are from EDOT, a characteristic peak at 1540 cm$^{-1}$ for C—N in-plane bending, and a peak around 1720 cm$^{-1}$ indicative of the stretch vibrations of C=O bonds in ester groups.

Figure 3:
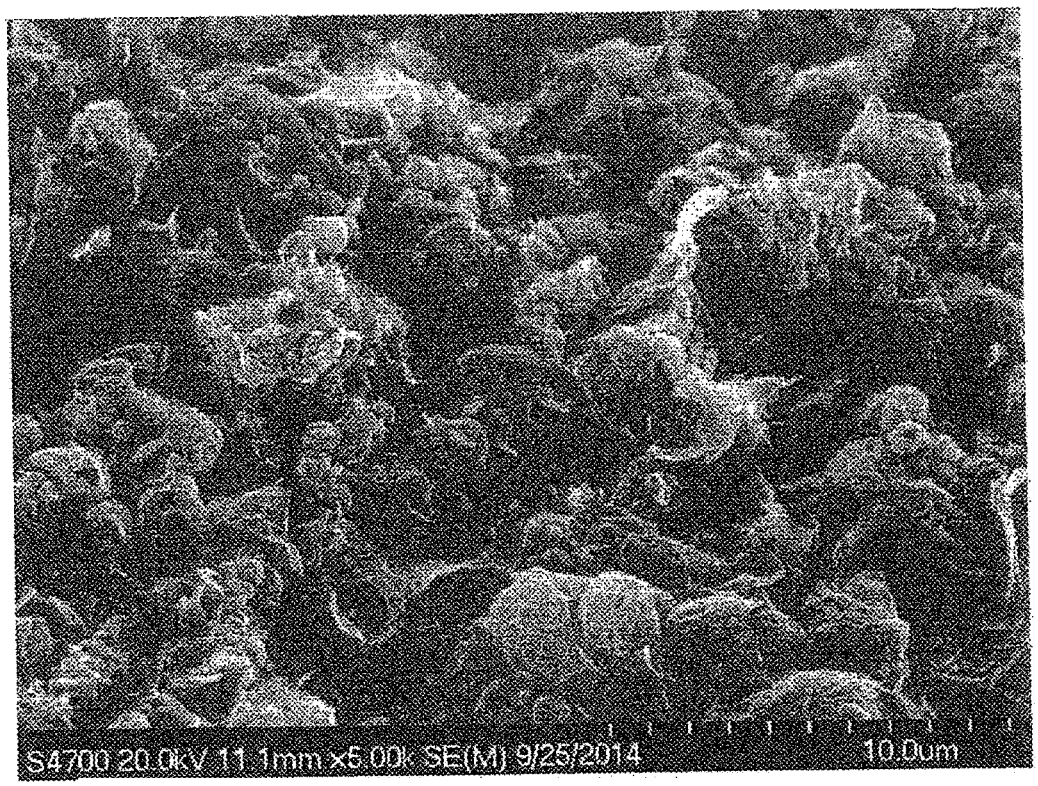
FIG. 3 is an SEM image of a PEDOT/graphene functional composite material.

Surface morphology of the composite material was also characterized and the results were summarized in FIG. 3. The paste can be directly cured to form a PEDOT/graphene functional composite material, or combined with other polymers to prepare other functional composite materials.

EXAMPLE 2

1) Preparation of Sulfonated Graphene

First of all, a certain amount of carboxylated graphene was weighed and dispersed in deionized water and the dispersion was facilitated by ultrasonic waves for 4 hours, so that a 10 mg/mL carboxylated graphene solution was prepared for subsequent use. A certain amount of a 4-aminobenzenesulfonic acid derivative R-1 was dissolved in deionized water (heating might be optionally carried out to facilitate the dissolution) to prepare a 20 mg/mL solution for subsequent use. The two solutions obtained above were mixed together in a volume ratio of 2:3, followed by addition thereto of 1-3 drops of dibutyltin dilaurate as a catalyst. The mixture was then heated with reflux at 95° C. to allow reaction for 10 hours. The system was then cooled to 90° C. and added with a certain amount of hydrazine hydrate, followed by reaction for 2 hours at the temperature that was maintained, so that sulfonated graphene was obtained. A ratio of the amount of the added hydrazine hydrate to that of the carboxylated graphene was 1.2 mL:1 g. A graft ratio of 60% was achieved.

2) Preparation of Conductive Polymer-Functionalized Graphene Composite Material 300 mg of the sulfonated graphene resulting from step 1) was first weighed and dissolved 100 mL of deionized water, resulting in a 3 mg/mL sulfonated graphene solution which was then added with 50 g of EDOT as a monomer and a certain amount of a sodium persulfate (Na$_2$S$_2$O$_8$) solution. The mixed solution was then maintained at room temperature to allow reaction for 6 hours. After spin distillation and concentration, a PEDOT/graphene composite was obtained in the form of a paste, which could be directly cured to form a PEDOT/graphene functional composite material, or combined with other polymers to prepare other functional composite materials. In the composite, sulfonated graphene and PEDOT were present in a mass ratio of 6:1, and n=1000.

EXAMPLE 3

1) Preparation of Sulfonated Graphene

First of all, a certain amount of carboxylated graphene was weighed and dispersed in deionized water and the dispersion was facilitated by ultrasonic waves for 6 hours, so that a 10 mg/mL carboxylated graphene solution was prepared for subsequent use. A certain amount of a 4-aminobenzenesulfonic acid derivative R-2 was then dissolved in deionized water (heating might be optionally carried out to facilitate the dissolution) to prepare a 20 mg/mL solution for subsequent use. The two solutions obtained above were mixed together in a volume ratio of 2:3, followed by addition thereto of 1-3 drops of dibutyltin dilaurate as a catalyst. The mixture was then heated with reflux at 95° C. to allow reaction for 10 hours. The system was then cooled to 90° C. and added with a certain amount of hydrazine hydrate, followed by reaction for 2 hours at the temperature that was maintained, so that sulfonated graphene was obtained. A ratio of the amount of the added hydrazine hydrate to that of the carboxylated graphene was 1.5 mL:1 g. A graft ratio of 75% was achieved.

2) Preparation of Conductive Polymer-Functionalized Graphene Composite Material

At first, 500 mg of the sulfonated graphene resulting from step 1) was weighed and dissolved 100 mL of deionized water, resulting in a 5 mg/mL sulfonated graphene solution which was then added with 100 g of EDOT as a monomer and a certain amount of a sodium persulfate (Na$_2$S$_2$O$_8$) solution. The mixed solution was then maintained at room temperature to allow reaction for 8 hours. After spin distillation and concentration, a PEDOT/graphene composite was obtained in the form of a paste, which could be directly cured to form a PEDOT/graphene functional composite material, or combined with other polymers to prepare other functional composite materials. In the composite, sulfonated graphene and PEDOT were present in a mass ratio of 10:1, and n=6000.

EXAMPLE 4

Preparation of Conductive Polymer/Graphene/Polymer Composite Material

Figure 4:
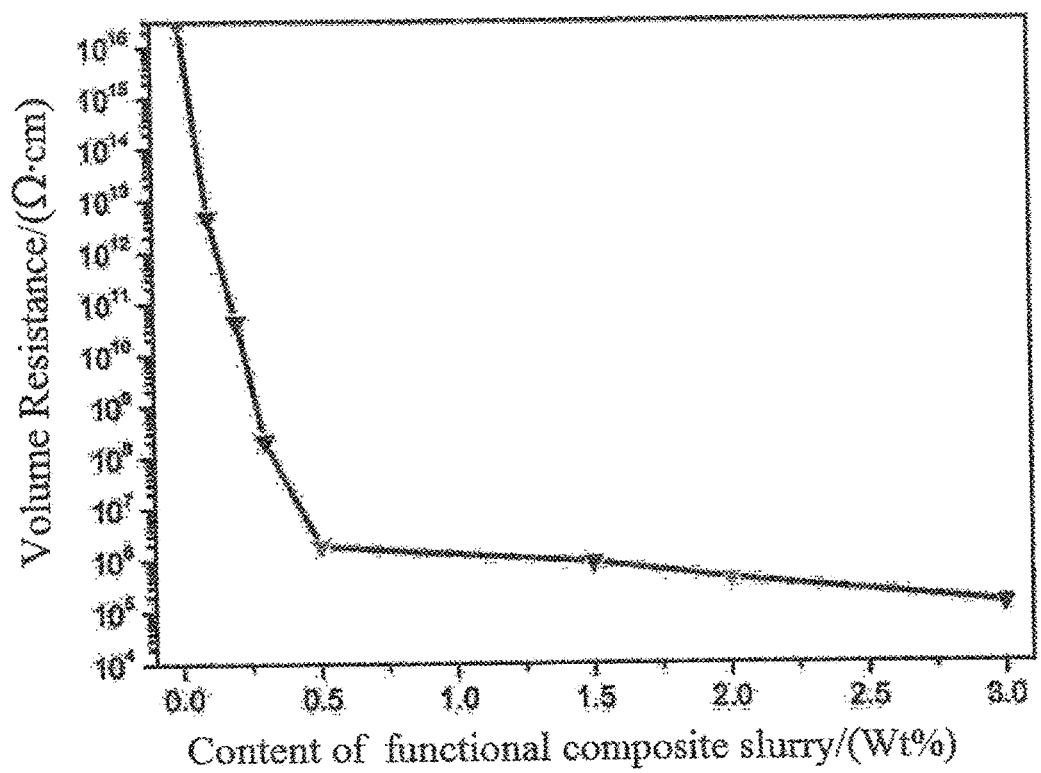
FIG. 4 is a diagram showing resistivity vs. functional component content profiles of conductive polymer/graphene/polymer functional composite materials according to Examples 4-6.

A conductive polymer/functionalized graphene/polymer functional composite material was prepared by blending 1 g of the concentrated paste, prepared as in Example 1, with 100 g of polyurethane (solution blending) so that a solid content of 0.1:100 by weight was obtained, and then drying and curing the blend. Thereafter, a series of tests were performed in conjunction with Examples 5 and 6 to analyze the dependence of conductivity on the content of the functional filler, as shown in FIG. 4.

Figure 5:
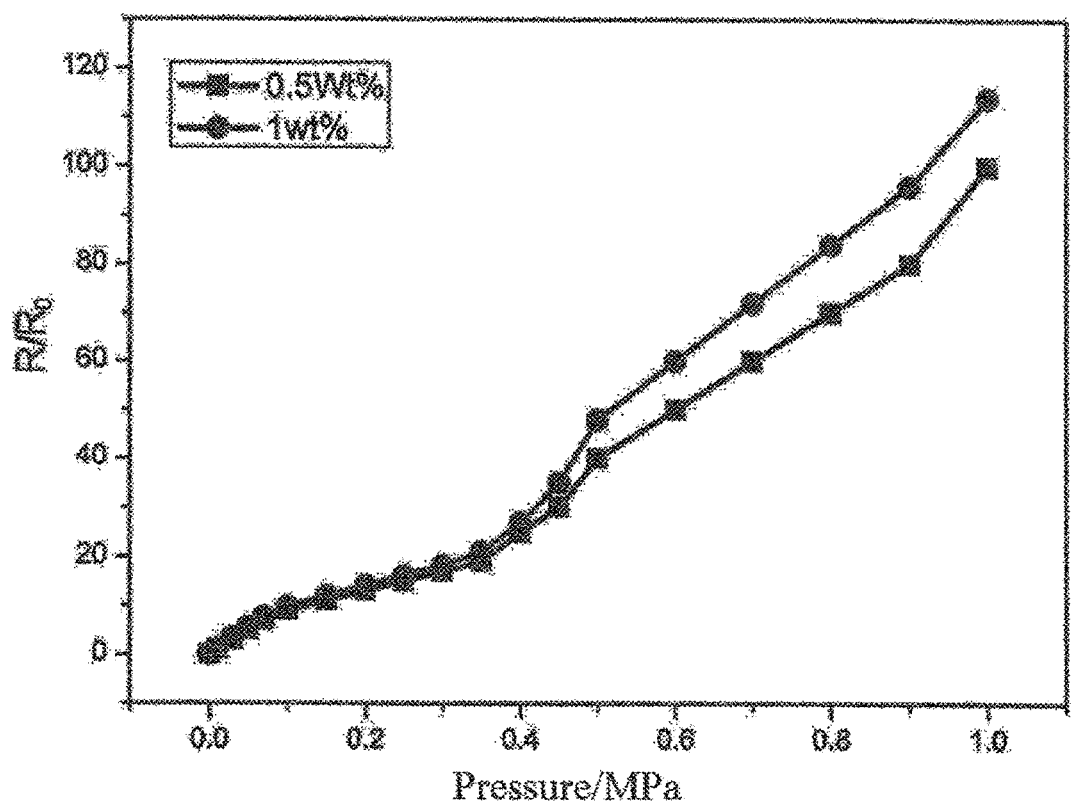
FIG. 5 illustrates variation of resistivity of the conductive polymer/graphene/polymer functional composite material of Example 4 with pressure.

Analysis was further conducted on the responsivity of the functional composite material to pressure, as shown FIG. 5.

The results showed that, with the solid content of the PEDOT/graphene composite functioning as the functional filler increasing, the volume resistivity of the composite material decreased abruptly to a percolation threshold at a solid content of 0.5 wt % and then evolved smoothly without much changes despite further increase of the filler content. In addition, as shown in FIG. 5, as the pressure increased, resistivity increased with increasing linearity, indicating very good electrical properties and piezoresistive response characteristics of the prepared functional composite material and hence applicability thereof to the fields of sensing materials and electromagnetic shielding.

EXAMPLE 5

Preparation of Conductive Polymer/Graphene/Polymer Composite Material A conductive polymer/functionalized graphene/polymer functional composite material was prepared by blending 10 g of the concentrated paste, prepared as in Example 2, with 100 g of natural rubber (direct blending) so that a solid content of 1:100 by weight was obtained, and then drying and curing the blend.

EXAMPLE 6

Preparation of Conductive Polymer/Graphene/Polymer Composite Material A conductive polymer/functionalized graphene/polymer functional composite material was prepared by blending 20 g of the concentrated paste, prepared as in Example 3, with 100 g of polystyrene (melt blending) so that a solid content of 2:100 by weight was obtained, and then drying and curing the blend.

EXAMPLE 7

Preparation of Conductive Polymer/Graphene/Polymer Composite Material 1 g of the concentrated paste, prepared as in Example 3, was coated on the surface of a polymer substrate (not limited thereto, as a metal, inorganic, fabric or the like substrate might be also suitable) to form a functional composite sheet. In the present example, polycarbonate was selected as the substrated. The coating thickness (0.1 μm-10 μm) might be determined as practically needed (i.e., not limited to the aforementioned thickness). The functional composite sheet might be of a structure of B/A, B/A/B, A/B/A, etc., where A denoted a functional film, and B represented a polymer film. Finally, it is subjected to drying and curing to result in a conductive polymer/functionalized graphene/polymer functional composite material.

What is claimed is:

1. A functional composite material with a double-conductive channel, comprising a sulfonated graphene whose surface is grafted with a conductive poly(3,4-ethylenedioxythiophene) (PEDOT) polymer, of the following general formula (1):

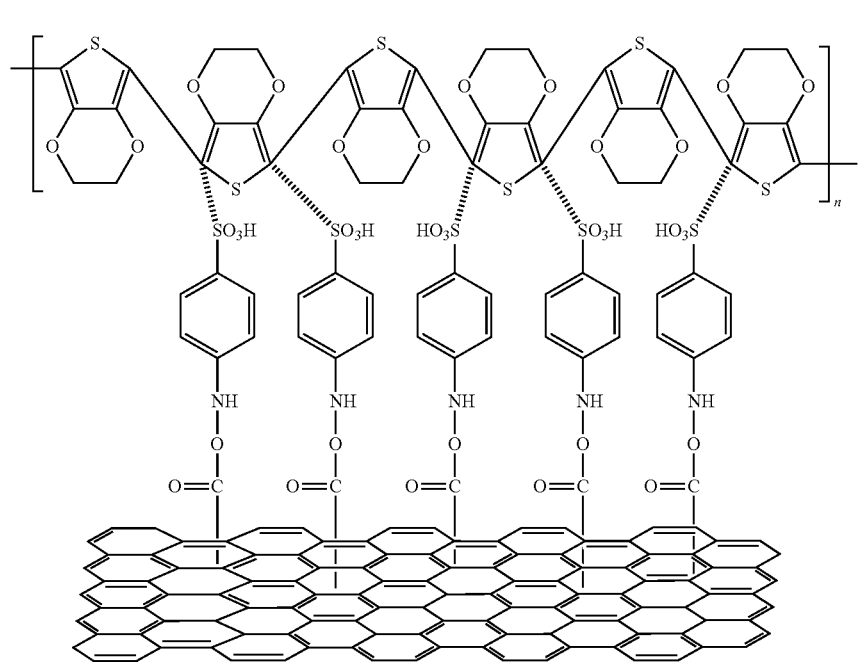

(1)

where, n represents the degree of polymerization and is an integer in the range of 100 to 8000.

2. The functional composite material with a double-conductive channel according to claim 1, wherein the sulfonated graphene and the conductive PEDOT are present in a weight ratio of 1:1 to 1:100.

3. The functional composite material with a double-conductive channel according to claim 2, wherein the weight ratio of the sulfonated graphene to the conductive PEDOT is from 1:3 to 1:10.

4. The functional composite material with a double-conductive channel according to claim 1, wherein the sulfonated graphene is obtained by grafting 4-aminobenzenesulfonic acid or a derivate thereof to graphene with a graft ratio of 1% to 80%.

5. A graphene-containing composite material, comprising constituents including a functional composite material with a double-conductive channel according to claim 1 and a polymer matrix.

6. The graphene-containing composite material according to claim 5, wherein the functional composite material with a double-conductive channel and the polymer matrix are present in a weight ratio of 0.1:100 to 20:100.

7. The graphene-containing composite material according to claim 5, wherein the polymer matrix is selected from a polyolefin-based polymer, a polyester-based polymer, a rubber-based polymer, polyoxymethylene, polysulfone and polylactic acid.

8. The graphene-containing composite material according to claim 7, wherein the polyolefin-based polymer is polyethylene, polypropylene, polystyrene or polyvinylidene chloride, wherein the polyester-based polymer is polyethylene terephthalate or polycarbonate, and wherein the rubber-based polymer is silicone rubber.

9. A method of preparing a functional composite material with a double-conductive channel according to claim 1, comprising the steps of:

1) dissolving sulfonated graphene in water, thereby obtaining a sulfonated graphene solution with a concentration of 1 mg/mL to 20 mg/mL;

2) adding 3,4-ethylenedioxythiophene (EDOT);

adding a 5-30 wt. % sodium persulfate ($Na_2S_2O_8$) solution such that the weight of the added sodium persulfate accounts for 10-60% of that of the sulfonated graphene;

4) gathering, after a reaction period of 4-8 hours at room temperature, a reaction product comprising a PEDOT/graphene composite paste; and 5) curing the PEDOT/graphene functional composite paste to obtain the functional composite material with a double-conductive channel.

10. The method according to claim 9, wherein the EDOT and the sulfonated graphene are present in a weight ratio of 1:1 to 100:1.

11. The method according to claim 9, further comprising the step of:

blending the PEDOT/graphene functional composite paste with a polymer matrix prior to said curing.

12. The method according to claim 11, wherein said blending comprises melt blending or solution bending.

13. The method according to claim 9, further comprising the step of coating the PEDOT/graphene functional composite paste on a substrate prior to said curing, wherein said curing is carried out in a vacuum at a temperature of 40-80° C. to obtain a PEDOT/graphene functional composite sheet having a thickness of 0.1 μm-10 mm from the substrate, and wherein the substrate is made of a polymer, metal or fabric.

14. A piezoresistive material comprising the functional composite material with a double-conductive channel according to claim 1.

15. An antistatic material comprising the functional composite material with a double-conductive channel according to claim 1.

16. An electromagnetic shielding material comprising the functional composite material with a double-conductive channel according to claim 1.

* * * * *